United States Patent [19]

Kawabata

[11] Patent Number: 4,710,705
[45] Date of Patent: Dec. 1, 1987

[54] NOISE REMOVAL CIRCUIT FOR USE IN A PARTIAL DISCHARGE MEASURING DEVICE OF A HIGH VOLTAGE APPARATUS

[75] Inventor: Osamu Kawabata, Kanagawa, Japan

[73] Assignee: Fuji Electric Company, Ltd., Kawasaki, Japan

[21] Appl. No.: 780,170

[22] Filed: Sep. 26, 1985

[30] Foreign Application Priority Data

Sep. 28, 1984 [JP] Japan ................ 59-203686
Dec. 20, 1984 [JP] Japan ................ 59-268979
Jan. 28, 1985 [JP] Japan ................ 60-14102
Sep. 19, 1985 [JP] Japan ................ 60-207590

[51] Int. Cl.$^4$ ............ G01R 19/00; G01R 23/16; H04B 1/10
[52] U.S. Cl. .................. 324/102; 324/77 H; 455/304
[58] Field of Search ......... 324/77 H, 102, 547, 324/551, 557; 375/102; 328/162, 165; 455/304

[56] References Cited

U.S. PATENT DOCUMENTS 2,799,734 7/1957 Camp .................. 324/77 H

Primary Examiner—Ernest F. Karlsen
Assistant Examiner—Vinh P. Nguyen
Attorney, Agent, or Firm—Staas & Halsey

[57] ABSTRACT

A noise removal circuit for use in partial discharge measuring device of a high voltage apparatus. The circuit includes a first phase shift/reduction device responsive to an input signal for passing it directly while delaying it by a predetermined time and for reducing the delayed signal from the directly passed signal a second phase shift/reduction device for passing an output of the first phase shift/reduction device directly while delaying the output by the predetermined time and for reducing the delayed signal from the directly passes signal, and a phase shift/multiplying device for directly passing an output signal of the second phase shift/reduction device while delaying it by a time twice the predetermined time and multiplying the directly passed signal with the delayed signal.

9 Claims, 17 Drawing Figures

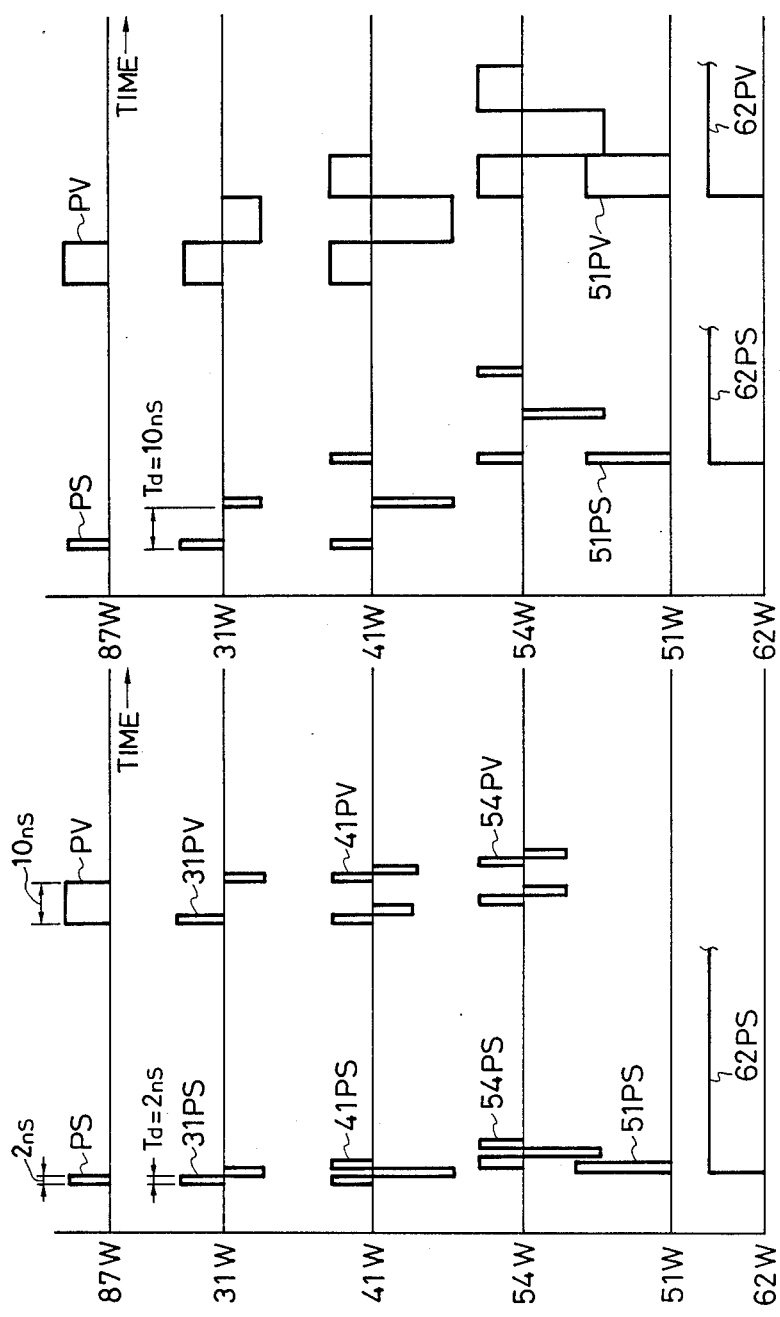

NOISE REMOVAL CIRCUIT FOR USE IN A PARTIAL DISCHARGE MEASURING DEVICE OF A HIGH VOLTAGE APPARATUS

BACKGROUND OF THE INVENTION

The present invention relates to a partial discharge measuring a device for measuring partial discharge pulse produced in a gas insulated electric apparatus such as gas insulated, sealed circuit breaker, gas insulated cable or gas insulated transformer or a high voltage apparatus such as high voltage rotary electric machine of solid insulative device of such as resin molded transformer, separately from electric noise and, particularly, to such measuring device having a noise remover circuit for reducing or removing single shot noises or periodic noise included in the partial discharge pulse and having a rising and/or falling time longer than a duration of the pulse.

When a characteristics of a sample apparatus is to be evaluated by measuring or observing a waveform, amplitude and/or frequency of occurence of the partial discharge pulse signal and if a level of noise such as periodic noise due to broadcasting wave introduced, through the apparatus acting as an antenna into a measuring circuit, on-off noise introduced through power transmission system into the measuring circuit or single shot noise such as electric discharge noise is high, an S/N ratio of the measuring circuit etc. is lowered and hence the evaluation accuracy is degraded.

As a noise removing circuit, it has been usual to use a filter having a passband in which main frequeency components of the pulse signal is included. When the passband is made narrower to improve the S/N ratio, the pulse signal waveform may be distorted or vibrate and when it is made wider, the S/N ratio for noise having a waveform which is closer to that of the main frequency component of the pulse signal is lowered. That is, it is practically impossible to obtain a noise removing circuit having a characteristic which satisfies the noise removal and where the original waveform maintains its performance.

FIG. 1 is a circuit construction of a conventional noise removing circuit which is applied to a partial discharge testing circuit for a high voltage electric device such as power cable. In FIG. 1, a reference numeral 1 depicts a power cable which is to be tested, 2 a terminal bushing for applying a test voltage to the power cable 1, 3 a coupling capacitor for partial discharge pulse detection, 4 a detection impedance, 5 a noise removing circuit composed of a delay line 6 and an adder circuit 7 and 8 an amplifier for amplifying the partial discharge pulse.

FIG. 2 shows signal waveforms for explaining an operation of the noise removing circuit. In FIG. 2, references W4, W6 and W7 depict an output signal waveform (terminal voltage at the detection impedance 4) of an input circuit 10, an output signal waveform of the delay line 6 and an output signal waveform of the adder 7, respectively. Also in FIG. 2, the signal W4 includes a partial discharge pulse P1 which is to be detected and a periodic noise N1 having a period $\tau$. The delay line 6 is designed to have a delay time corresponding to a half ($\tau/2$) of the period of the periodic noise N1 so that the output waveform W6 includes a noise N and discharge pulse P2 which are delayed from the input signals N1 and P1 by $\tau/2$, respectively. As a result, the phase of the noise components N1 and N2 of the input signals W4 and W6 to the adder 7 are opposite to each other and cancelled out by the adder 7 and only the discharge pulses P1 and P2 are supplied to the amplifier 8 provided at a output terminal 9 after amplified, as shown by the waveform W7.

In this circuit construction, since the periodic noise is delayed by a half period, it is necessary to regulate the delay time of the delay line 6 such that it coincides with the period of the periodic noise. In addition, when a plurality of periodic noises exist, a corresponding number of noise removing circuits are required.

SUMMARY OF THE INVENTION

The present invention was made in view of the state of art mentioned above, and an object of the present invention is to provide a partial discharge measuring device equipped with a noise removing circuit which is capable of attenuating or removing single shot noise having rising and falling times which are long compared with a duration of a partial discharge pulse and/or periodic noise, without deformation of the partial discharge pulse waveform.

The above object is achieved, according to the present invention, by a provision of a partial discharge measuring device comprising first and second phase shift/reduction means, each including a delay circuit for providing an input signal and same signal which is delayed from the input signal by a time equal to or longer than a duration of a partial discharge pulse signal taking an upper limit of duration due to a variation of waveheight into consideration and providing a difference between these signals, said first and second phase shift/reduction means being connected in series so that the input signal is converted into a pulse series including the input pulse and two delayed pulses and noise is converted into a single pulse having magnitude reduced correspondingly to a ratio of the delay time to a rising or a falling time of the noise and having a short duration, and a phase shift/multiplying means composed of a delay circuit having delay time twice the delay time of the phase shift/reduction means and a multiplying circuit having inputs to which an input and an output of the delay circuit are supplied. The phase shift/multiplying means being connected to an output of the phase shift/reduction means so that the pulse series and same pulse series delayed such that only one of the three pulses of the pulse series appears at the same time at which only one of the three pulses of the delayed pulse series are multiplied with each other to cancel out the pulses except the one pulses and the single noise pulse from the phase shift/reduction means and the delayed pulse are cancelled out by multiplication therewith, whereby only the partial discharge pulse signals overlapping at the same time are output as a pulse signal having waveform analogous to the original waveform. The partial discharge pulse overlapped at the time have a waveform corresponding to a square of the waveform of the discharge pulse due to multiplication. However, it can be transformed into one analogous to the original waveform by treating it through a square rooting circuit.

The pulse width of the partial discharge pulse depends upon the kind of defect of the high voltage device. In order to measure a partial discharge pulse occuring in a gas such as SF6 gas in a gas insulated sealed circuit breaker (GIS), the delay time of the phase shift/reduction means may be set as 2 nS to 4 nS. On the other hand, when a void discharge pulse produced in a fine void in a solid insulator such as insulating spacer is to be measured, the delay time may be set as 10 nS to 30 nS.

The reducing circuit portion of the phase shift/reduction means and the multiplying circuit portion of the phase shift/multiplying means may be constituted with operational amplifiers, respectively. However, when there is a probability of a high surge voltage coming into the measuring system during the measurement, it is advisable to constitute the phase shift/reduction means with a 180° distributor composed of a high frequency transformer and a mixer composed of a high frequency transformer or a resistance means and to connect it through the delay circuit to the input circuit.

According to the present invention, other partial discharge pulse having rising and falling times each longer than the delay time provided by the phase shift/reduction means can also be removed as noise. By making the delay time variable according to the kinds of partial discharge and measuring discharges with using variable delay times, the kind of discharge produced in the device to be tested can be identified.

When the device to be tested is a SF6 gas insulated device such as GIS, the input to the first phase shift/reduction means is supplied through a bandpass amplifier whose passband may be from 50 MHz to 1000 MHz.

The upper limits of frequency components of the partial discharge pulse in SF6 gas and the void discharge pulse are distributed in a range from 50 MHz to 2000 MHz, while the upper frequency limits of thyrister noise, that of partial discharge pulse in oil of an oil filled device and that of corona pulse of a power transmission line are substantially 10 MHz or lower, several MHz or lower and 10 MHz or lower, respectively. Therefore, the S/N ratio of the measuring device can be improved by blocking these lower frequency regions.

BRIEF DESCRIPTION OF THE DRAWINGS

FIG. 12 shows waveforms for explaining an operation of the circuit in FIG. 11;

FIG. 13 shows waveforms similar to those in FIG. 12 when the delay time of the circuit is different;

DESCRIPTION OF THE PREFERRED EMBODIMENTS

Figure 3:
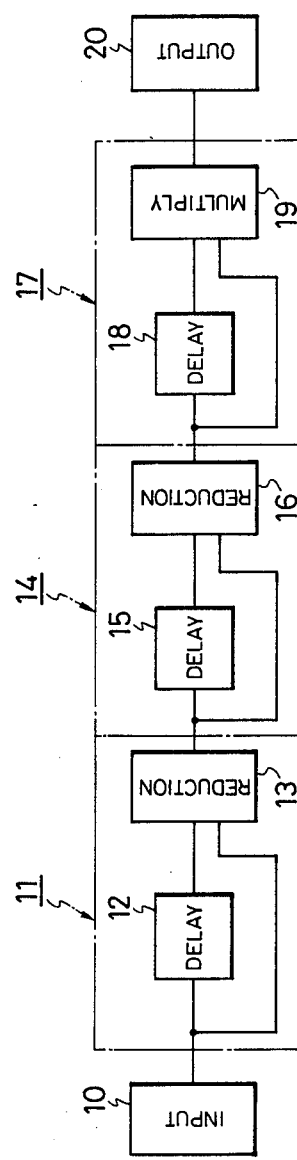
FIG. 3 is a block circuit diagram showing a main portion of an embodiment of the present invention.

In FIG. 3 which shows an embodiment of the present invention, a reference numeral 10 depicts an input circuit which may be an impedance matching circuit, from which a pulse signal which contains noise and is to be measured is outputted as an analog signal having a waveform anologous to an original waveform thereof, 11 a first phase shift/reduction circuit and 14 a second phase shift/reduction circuit connected in series to the first circuit 11. Each of the phase shift/reduction circuits 11 and 14 is constituted with a delay circuit 12 (or 15) such as delay line or coaxial cord having a delay time Td equal to duration Wp of the partial discharge pulse signal and a reduction circuit 13 (or 16) having inputs supplied with an input and output signals of the delay circuit 12 (or 15).

A reference numeral 17 depicts a phase shift/multiplying circuit having an input supplied with an output signal from the second phase shift/reduction circuit 14. The phase shift/multiplying circuit 17 is constituted with a delay circuit 18 having a delay time (2Td) twice the delay time Td of the first (or second) phase shift/reduction circuit and a multiplying circuit 19 having inputs supplied with input and output signals of the delay circuit 18. An output circuit 20 is connected to an output of the multiplying circuit 19. The circuit 20 may be constituted with any or a combination of any of a square rooting circuit, an amplifier circuit, an alternating circuit and an impedance matching circuit etc., according to demand.

Figure 4:
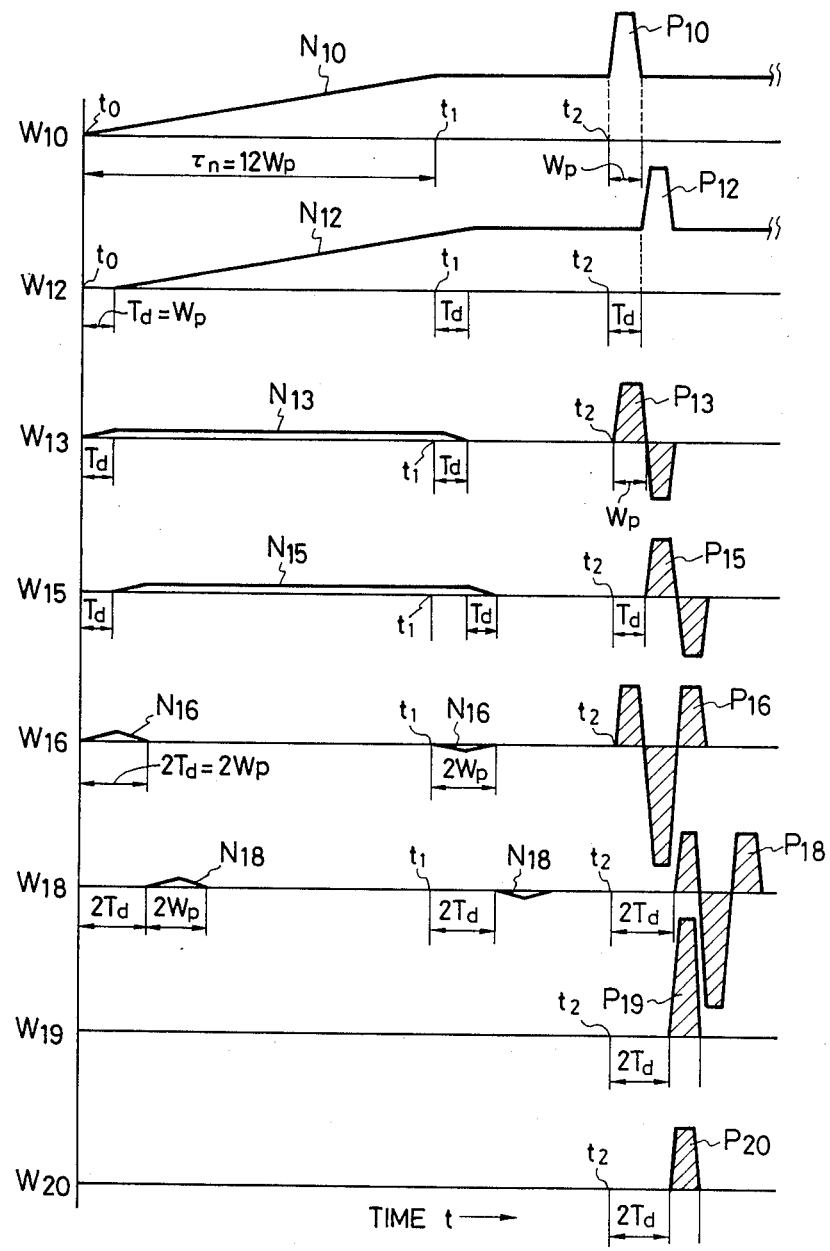
FIG. 4 shows signal waveforms for explaining an operation of the circuit in FIG. 3 when an input signal contains signal shot noise.

FIG. 4 shows signal waveforms for explaining an operation of the partial discharge measuring device constituted as shown in FIG. 3. In FIG. 4, it is assumed that an input signal contains a pulse signal P10 which has a trapezoidal waveform whose duration or pulse width Wp is 50 nS and is to be measured and single shot noise N10 which has a trapezoidal waveform having a rising (or falling) time τn of 600 nS which is 12 times the pulse width Wp. Further, as the delay circuit of the phase shift/reduction circuit, a delay line available from Showa Densen Co. with the trade name of Single-In-Line type AT which provides the delay time Td equal to the pulse width of the pulse P10 is used and as the reduction circuit and the multiplying circuit a wide range operational amplifier available from OEI as model No. 9826 and a wide range linear multiplier available from Analog Devices as model No. AD539 are used, respectively. The circuit constructed with these components may be suitable to maintain an original waveform of the pulse signal whose pulse width Wp is as short as 50 nS. For substantially different pulse width Wp and delay time Td, the circuit components should be changed accordingly.

In FIG. 4, an output signal waveform of the input circuit is shown by W10 which contains the trapezoidal noise N10 and the trapezoidal pulse signal P10 to be measured which rises at a time instance t2. The noise N10 rises at a time instance t0 and has a rising time $\tau n$ which is 12 times the pulse width Wp of the pulse signal P10 and a falling time $\tau n$ which is not shown for simplicity.

The signal W10 passes through the delay circuit 12 of the first phase shift/reduction circuit 11 and delayed by Td as shown by a waveform W12. The waveform W12 contains noise N12 which is delayed from t0 by Td(=Wp) and a pulse signal P10, which is delayed from t2 by Td. That is, the waveforms of the noise N12 and the pulse signal P12 are substantially the same as those of the noise N10 and the pulse signal P10, respectively.

An output of the reduction circuit 13 has a waveform W13 which is the waveform W10 reduced by the waveform W12. That is, the waveform W13 contains a trapezoidal noise N13 which rises at the time instance t0 with a rising time Td and falls at a time instance t1 corresponding to an end of period $\tau n$ with a falling time Td and a pulse series P13 composed of a trapezoidal pulse which is the same in shape and timing as the pulse P10 and a trapezoidal pulse which is the same in shape and timing as, but opposite in polarity to the pulse P12. The waveheight of the noise N13 is reduced to about one twelveth the input noise pulse N10 and the width thereof is shortened to ($\tau n$+Td).

Waveforms W15 and W16 are of output signals of the delay circuit 15 and the reduction circuit 16 of the second phase shift/reduction circuit 14, respectively. That is, the waveform W15 is composed of a pulse signal P15 and noise N15 and is the waveform W13 delayed by Td and the waveform W16 is obtained by reducing the waveform W15 from the waveform W13. The waveform W16 contains a pair of triangular positive and negative noises N16 having width of 2Td=2Wp and rising at the time instances t0 and t1 respectively, and a pulse signal P16 composed of three pulses starting at the time instance t2.

Waveforms W18 and W19 are of output signals of the delay circuit 18 and the multiplying circuit 19 of the phase shift/multiplying circuit 17, respectively. The waveform W18 contains a pair of noises N18 and a pulse series P18 composed of three pulses and is the waveform W16 delayed by the delay circuit 18 by 2Td and the waveform W19 is obtained by multiplying the waveforms W16 with the waveform W18 by the multiplying circuit 19. The waveform W19 contains only one pulse P19 which is a product of simulteneously occuring ones of the pulses in the pulse trains P16 and P18 and rises at a time instance delayed from the time instance t2 by 2Td.

When the output circuit 20 is composed of square root circuit, the waveform W19 is square rooted thereby, resulting in a waveform W20 which is a final output signal of the partial discharge measuring device and has waveheight and pulse shape similar to those of the original waveform.

Since there is some attenuation of the signal during the transmission even if the delay circuit is constituted with components having a good high frequency responses and components constituting the reduction circuit have some amplification function, the output circuit 20 may be constituted with any of or any combination of the square root circuit, an amplifier and an attenuation circuit according to demand of compensation for variations of the signal transmitted through the whole measuring device.

Figure 5:
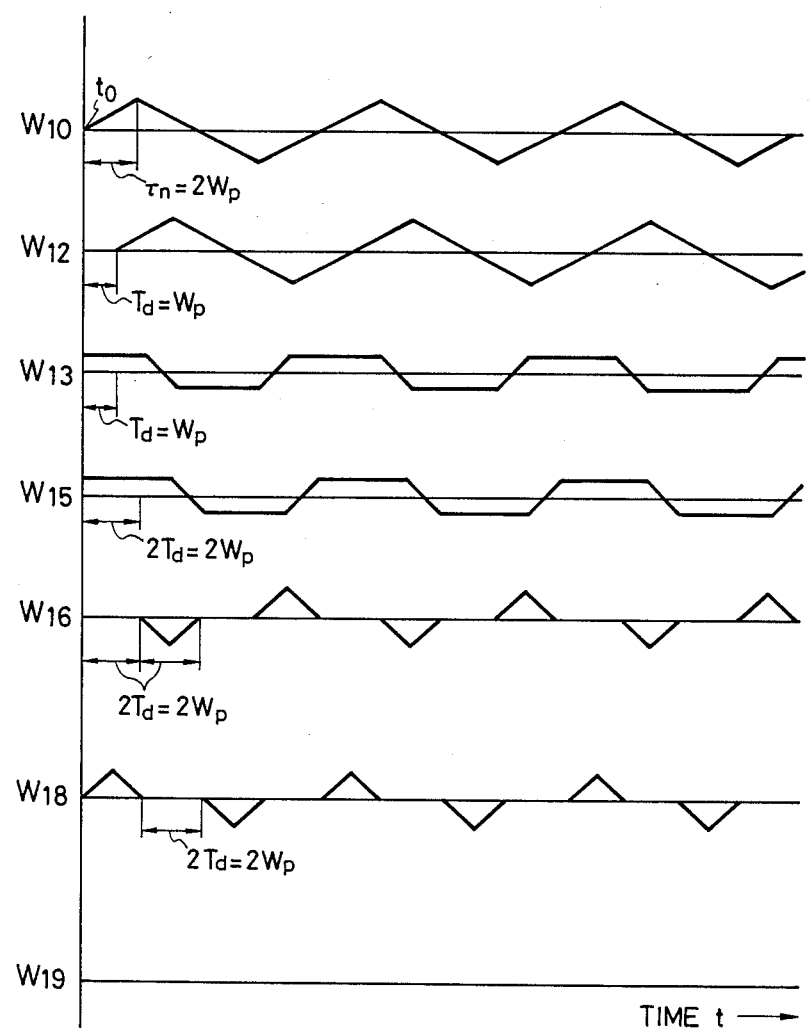
FIG. 5 shows signal waveforms for explaining an operation of the circuit in FIG. 3 when the input signal contains periodic noise.

FIG. 5 shows signal waveforms for explaining an operation of the partial discharge measuring device in FIG. 3 with respect to a periodic noise which is, in this case, an alternative triangular wave having a rising time (and falling time) $\tau n$ which is twice the pulse width Wp of the pulse signal to be measured. In FIG. 5, an output signal W10 of the input circuit 10 is alternative triangular noise signal. The noise signal W10 is delayed by the delay circuit 12 of the first phase shift/reduction 11 circuit by Td=Wp, resulting in a waveform W12. The waveform 10 is reduced by the waveform W12 in the reduction circuit 13, resulting in a trapezoidal waveform W13 whose magnitude is a half of the waveheight of the noise signal W10 or W12.

The noise having the waveform W13 is delayed by the delay circuit 15 of the second phase shift/reduction circuit 14 by Td=Wp, resulting in a waveform W15. The waveform W13 is reduced by the waveform W15 by the reduction circuit 16 of the second phase shift/reduction circuit 14, resulting in a waveform W16 which is a series of alternative triangular pulses occuring at the same timing as that of the waveform W10 with a delay of 2Td and each having pulse width and waveheight which are substantially equal to those of the original noise waveform having a rising time $\tau n$=2Wp.

The waveform W16 is delayed by the delay circuit 18 of the phase shift/multiplying circuit 17 by 2Td, resulting in a waveform W18. The waveform W16 and W18 are multiplied by the multiplier 19, resulting in a waveform W19. Therefore, the periodic noise can be completely removed.

Figure 6:
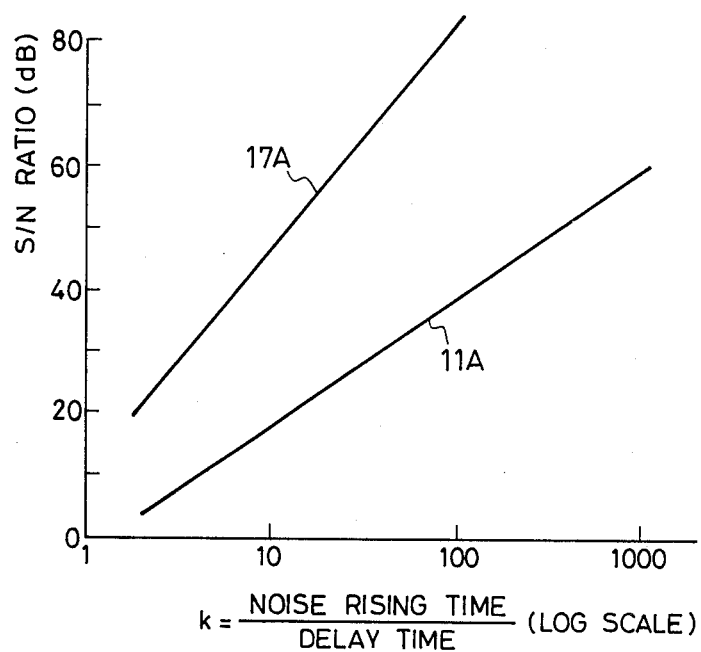
FIG. 6 is a characteristic s curve showing a S/N ratio of the circuit in FIG. 3.

FIG. 6 is a graph showing a plot of S/N ratio of the partial discharge measuring device shown in FIG. 3 obtained by using the rising time (falling times) of noise as a variable. In FIG. 6, a coordinate shows the S/N ratio and abssissa shows a ratio k=(noise rising time ($\tau n$))/ (delay time (Td)). A curve 11A shows the S/N ratio of the output signal of the first phase shift/reduction circuit 11 and a curve 17A the S/N ratio of the output signal of the phase shift/multiplying circuit 17.

The curve 11A is a linear line approximated by S/N ratio $\div 20 \log k$ (dB) since the noise is trapezoidal having a linear rising portion. Further, although the S/N ratio of the output signal of the phase shift/multiplying circuit becomes infinite theoritically, it becomes practically as shown due to influence of such things as field-through noise of the multiplying circuit.

It is generally that the longer the rising, falling time $\tau n$ compared with the delay time Td of the delay circuit, i.e., the pulse width of the partial discharge pulse signal, provides the better the S/N ratio. In the partial discharge measuring device shown in FIG. 3, it is possible to reduce the noise level to about one tenth even under a condition of $\tau n/Td$=2 and the noise level can be reduced to one hundredth or lower under a condition $\tau n/Td$=10.

As mentioned, in handling noise whose rising time n is longer than the delay time Td of the delay circuit, the first phase shift/redcution circuit 11 functions to reduce the noise level by delaying the input signal to be supplied to one of the inputs of the reduction circuit 13 by Td, the second phase shift/reduction circuit 14 functions to divide the noise into a plurality of discrete noise pulses by delaying the input signal to be supplied to one of the inputs of the reduction circiut 16 and the phase shift/multiplying circuit 17 functions to make a result of multiplication zero by controlling an overlapping of the discrete noise pulses, so that teh noise is substantially reduced totally. On the other hand, in handling the partial discharge pulse signal, it is important to maintain the original waveform of the pulse signal. It means that, for the constitutional circuit components the high frequency response thereof is important and these components should be combined so that three pulses produced by passing the pulse signal through the phase/reduction circuits is, on the other hand, supplied to the multiplying circuit directly and, on the other hand, delayed and supplied to the multiplying circuit such that only one of the three pulses not delayed and only one of the three delayed pulses are overlapped in time, the remaining pulses being cancelled out by the multiplication. Thus, the three circuits 11, 14 and 17 function independently from each other and, therefore, if the ratio Td/Wp is very large, a sufficient noise reduction can be provided by only the first phase shift/reduction circuit. Thus, it may be possible to constitute a noise removing circuit by using the first phase shift/reduction circuit independently.

Figure 7:
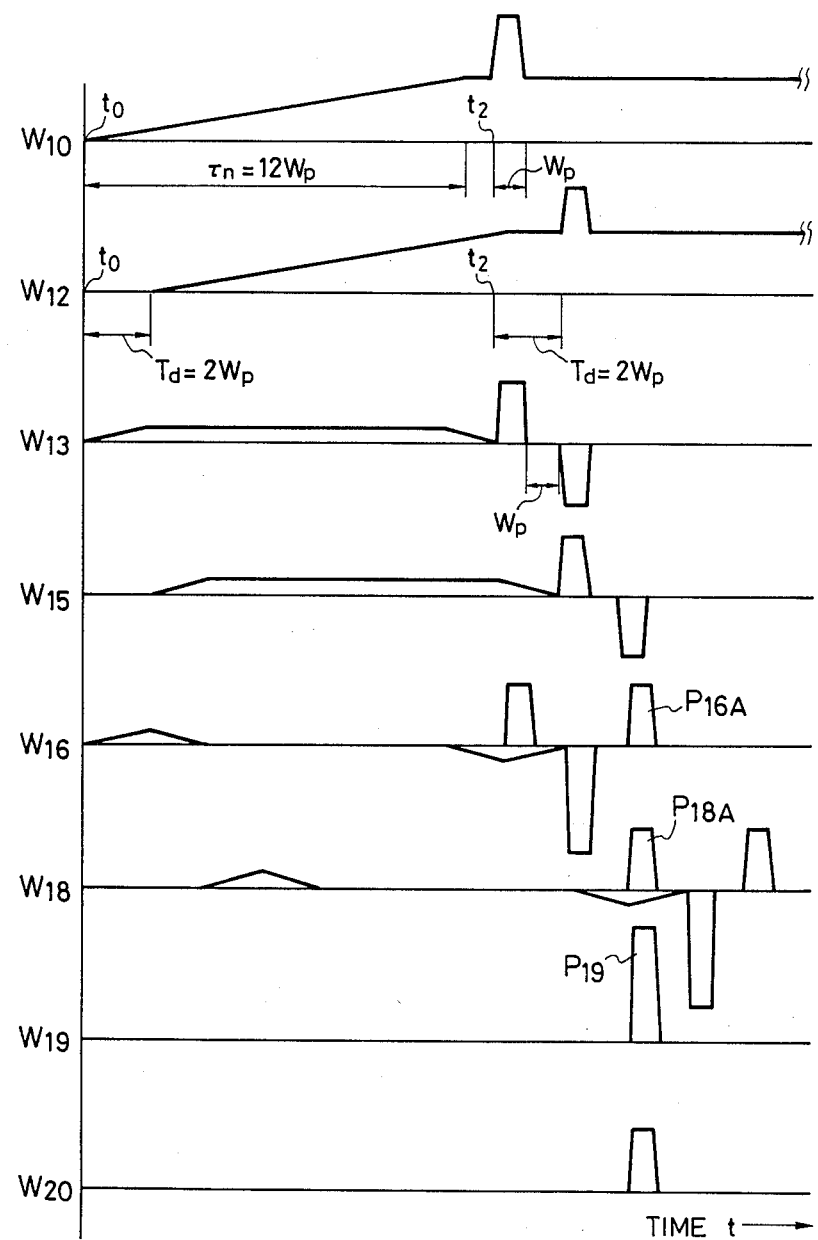
FIG. 7 is shows signal waveforms when a delay time is different from that by which the signal waveforms in FIG. 4 are obtained.

FIG. 7 shows another example of noise removal by using the circuit construction shown in FIG. 3, in which the delay time Td is set as being twice the pulse width Wp of the partial discharge pulse.

In this example, the delay times of the delay circuits 12 and 15 are selected as being 2Wp, respectively, and that of the delay circuit 18 is set as 4Wp. As a result, waveforms W13, W15, W16 and W18 in FIG. 7 include space times Wp between the pulse signals, respectively. However, in the phase shift/multiplying circuit, a pulse P16A of the waveform W16 coincides in time with a pulse P18A of the waveform W18, resulting in a single pulse signal P19 at the output of the multiplying circuit 19 as in the case of FIG. 4. Further since Td=2Wp, the ratio $\tau n/Td=k$ is smaller and thus the S/N ratios of the output signals of the circuits 11, 14 and 17 become about a half (6 dB) of those shown in FIG. 4, respectively, as shown in FIG. 6. That is, the delay time Td of the delay circuits 12 and 15 are not always equal to the width Wp of the pulse signal to be measured and thus it may be possible to set the delay times relatively long taking a variation of the width of the pulse signal to be measured into consideration.

Figure 1:
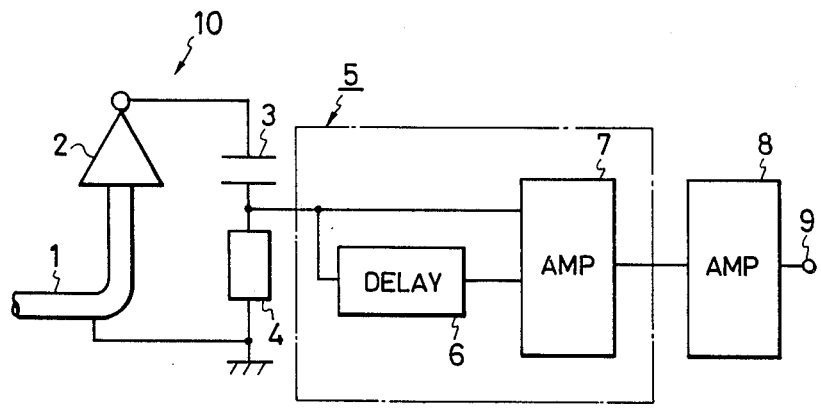
FIG. 1 is shows a construction of a conventional noise removing circuit for a partial discharge test circuit for power cable.
Figure 2:
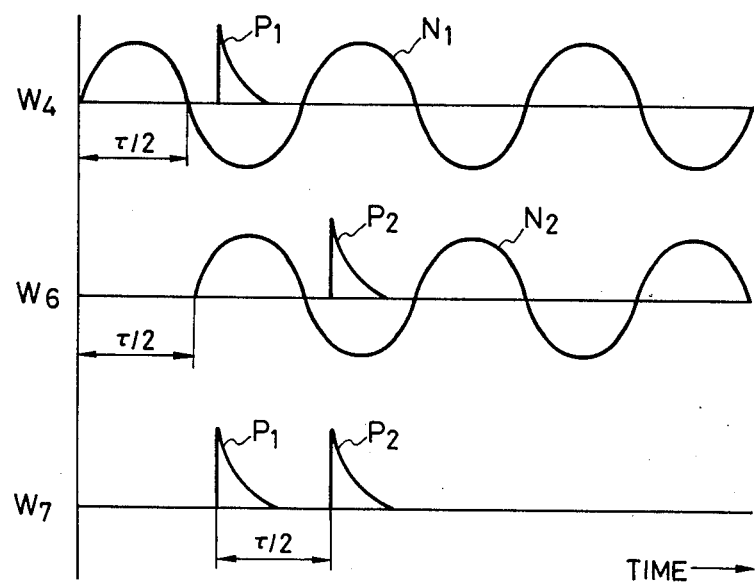
FIG. 2 shows waveforms for explaining an operation of the circuit in FIG. 1.

In FIGS. 4 and 7, the partial discharge pulse signal is trapezoidal having width Wp=50 nS. It should be noted, however, that the present device is also effective in providing an output whose waveform is very close to the original signal waveform even when it is an attenuating waveform as shown in FIG. 2 or other waveforms including vibrating components, provided that the circuit components have good high frequency responses.

Figure 8:
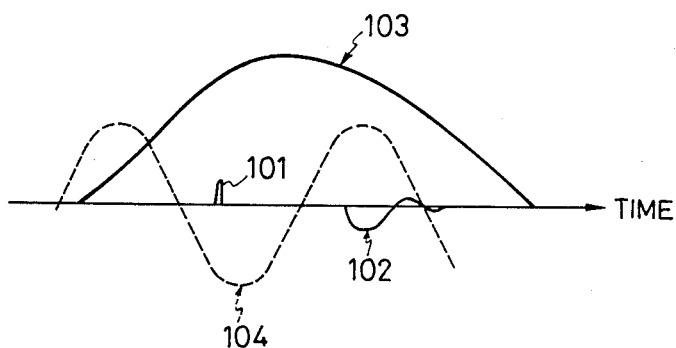
FIG. 8 depicts waveforms showing directions of the partial discharge pulse signal and external noise.

FIG. 8 illustrates partial discharge pulse and external noise contained in a detection signal from GIS, in which pulses 101 and 102 show internal coronas each having width of several nS produced in SF6 gas therein and internal void coronas each having width of several 10 nS which are produced in fine voids in solid insulators such spacers etc, respectively. A pulse shaped external noise 103 and continuous external noise 104 are superimposed on these internal coronas. The external noise 103 includes transmission cable corona having width of several 100 nS produced in an overhead power transmission line and thyristor pulse having width of several $\mu$s produced by thyristor such as inverter as well as corona having rising time of 1$\mu$S and width of several $\mu$s produced in oil in an oil filled cable or oil filled transformer when the device to be tested is a gas insulated device or solid insulator device. These external noises disturb a monitoring of the internal coronas. The continuous external noise 104 includes broadcasting wave and carrier wave (several 10 to several 100 KHx) for inter-power plant communication.

According to the present invention, it is possible to measure a partial discharge pulse in SF6 gas of the GIS etc. by setting the delay time of the phase shift/reduction circuit as 2 nS to 4 nS and to measure void discharge pulse produced in fine voids in the solid insulator such as an insulating spacer by setting the delay times as 10 nS to 30 nS.

Figure 9:
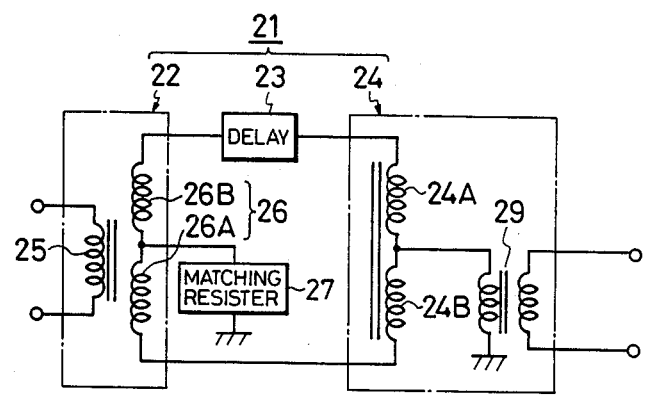
FIG. 9 shows a circuit diagram of a phase shift/reduction means according to another embodiment of the present invention.

FIG. 9 shows another embodiment of the phase shift/reduction circuit according to the present invention. In FIG. 9, the phase shift/reduction device 21 which is equivalent to the device shown in FIG. 3, comprises a 180° distributor 22 composed of a high frequency transformer, a delay circuit 23 connected to either side of a secondary winding 26 of the transformer and a mixer 24 connected through the delay circuit 23 to the secondary winding 26 of the 180° distributor 22. A partial discharge signal containing noise is divided into a non-inverted signal and an inverted signal by the 180° distributor 22 between which a time difference corresponding to a pulse width of the input pulse signal is given by the delay circuit 23. The mixer 24 adds the inverted and non-inverted signals separated in time as above to obtain a difference signal therebetween. The 180° distributor 22 preferably comprises a high frequency transformer having a ferrite core (e.g., Ferrite Transformer (trade name) type HYB-1 available from R & K Co.). The secondary winding 26 is grounded at a center point thereof through a matching resister 27 to provide a pair of coil portions 26A and 26B which are in symmetry with respect to the center point and are connected in parallel with each other and with a primary winding 25 to provide a 180° distributor which is of low loss over a frequency range up to several hundred MHz according to the principle of distributed constant circuit. By treating an insulating coating of the coils or immersing the coils in a resin, it is possible to prepare the 180° distributor whose breakdown voltage is several thousands volts and which is compact in size, economically. The delay circuit 23 may be fabricated by using a delay cable, a LC type delay line or a coaxial cord of a desired length, with a high breakdown voltage characteristics. The mixer 24 may be composed of a ferrite core type mixer having parallel coils 24A and 24B, such as Power Combiner (tradename) of the P & K Co., and a high frequency output transformer 29 connected between a junction of the coils 24A and 24B and grounding point and acting as an impedance matching circuit as well.

Figure 10:
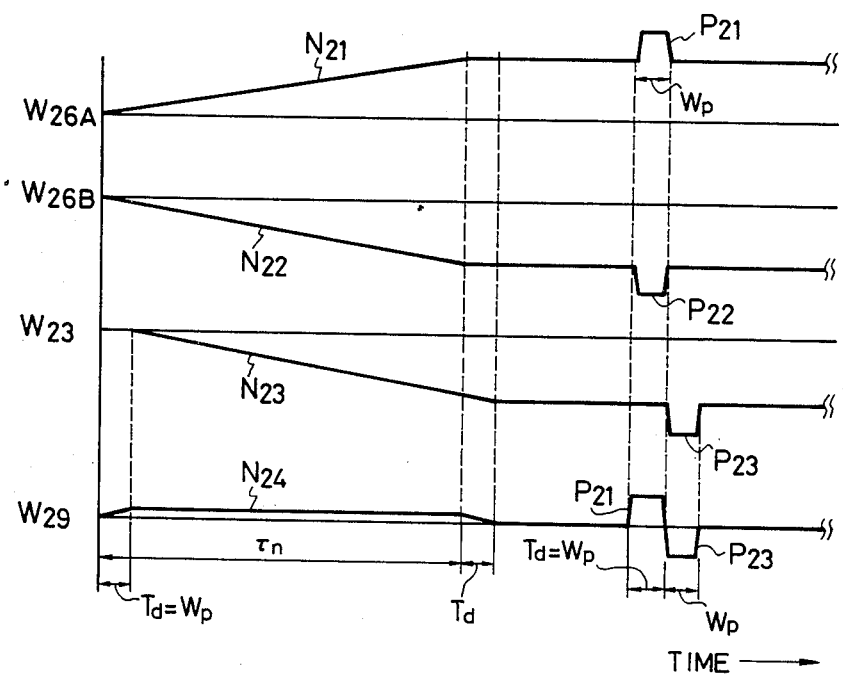
FIG. 10 shows signal waveforms for explaining an operation of the circuit in FIG. 9.

FIG. 10 explains an operation of the phase shift/reduction circuit shown in FIG. 9 when an input pulse to be supplied to the primary winding 26 of the 180° distributor 22 is composed of a pulse signal P21 to be measured having trapezoidal waveform whose pulse width Wp 50 nS and a single shot type noise N21 of trapezoidal shape having a rising or falling time $\tau n$ 12 times the pulse width Wp, i.e., 600 nS, overlapped therewith, the falling portion of the noise N21 being omitted. In FIG. 10, waveforms W26 and W26B are voltage waveforms of the coil 26A (non-inverted side) and 26B (inverted side) of the secondary winding 26 of the 180° distributor 22 with respect to ground potential, respectively. That is, non-inverted signal and noise P21 and N21 and inverted signal and noise P22 and N22 are provided by the distributor. The inverted signal and noise P22 and N22 are passed through the delay circuit 23 having a delay Td=Wp, resulting in a waveform W23 which is composed of a noise pulse N23 delayed by Td=Wp with respect to the signal N22 and a pulse P23 delayed by Wp. Then the non-inverted signal N21 and P21 and the delayed signals N23 and P23 are supplied to the mixer 24 and added to each other therein, resulting in a difference signal at an output of the power transformer 29, which has a waveform W29 composed of a trapezoidal noise N24 of reduced level, a pulse substantially the same as the pulse P21 and a pulse P23 which is also substantially the same as the pulse P21 inverted. The noise reduction rate with respect to the original noise N21 is proportional to the ratio $\tau n/Td$ and, therefore, it is about 1/12 in the shown embodiment.

With the phase shift/reduction circuit constituted with the 180° distributor comprising a ferrite core type high frequency transformer, the mixer 24 having a similar structure to the transformer, the output transformer 29 and the delay circuit 23, noise removing effect similar to that obtainable in the preceding embodiment is obtained. Further, the high frequency transformer and the mixer used may be higher in breakdown voltage against surge voltage than the high speed operational amplifier used for the reduction circuit in the preceding embodiment by about two digits and lower in cost than the operational amplifier by about one digit. Therefore, when the noise removing circuit of the partial discharge measuring device for high voltage apparatus is constituted with the above mentioned phase shift/reduction circuit which is durable against switching surges or thunder surges which may be several thousand volts and introduced through the high voltage apparatus into the measuring device, the noise removing device can also serve as protection circuit for the measuring device including electronic circuits arranged in the output side of the phase shift/reduction circuit because surge voltage having duration of the order of microsecond can be reduced in waveheight to one several hundredth in the phase shift/reduction circuit.

Although, in FIG. 9, the mixer 24 is constituted with the coils 24A, 24B and the high frequency output transformer 29, these elements may be substituted by resistors, respectively, when a some increase of loss in the mixer is allowable. When the output transformer 29 is arranged in the input side of the mixer 24, the latter can be used as the 180° distributor. In such case the 180° distributor 22 can be used as the mixer.

Figure 11:
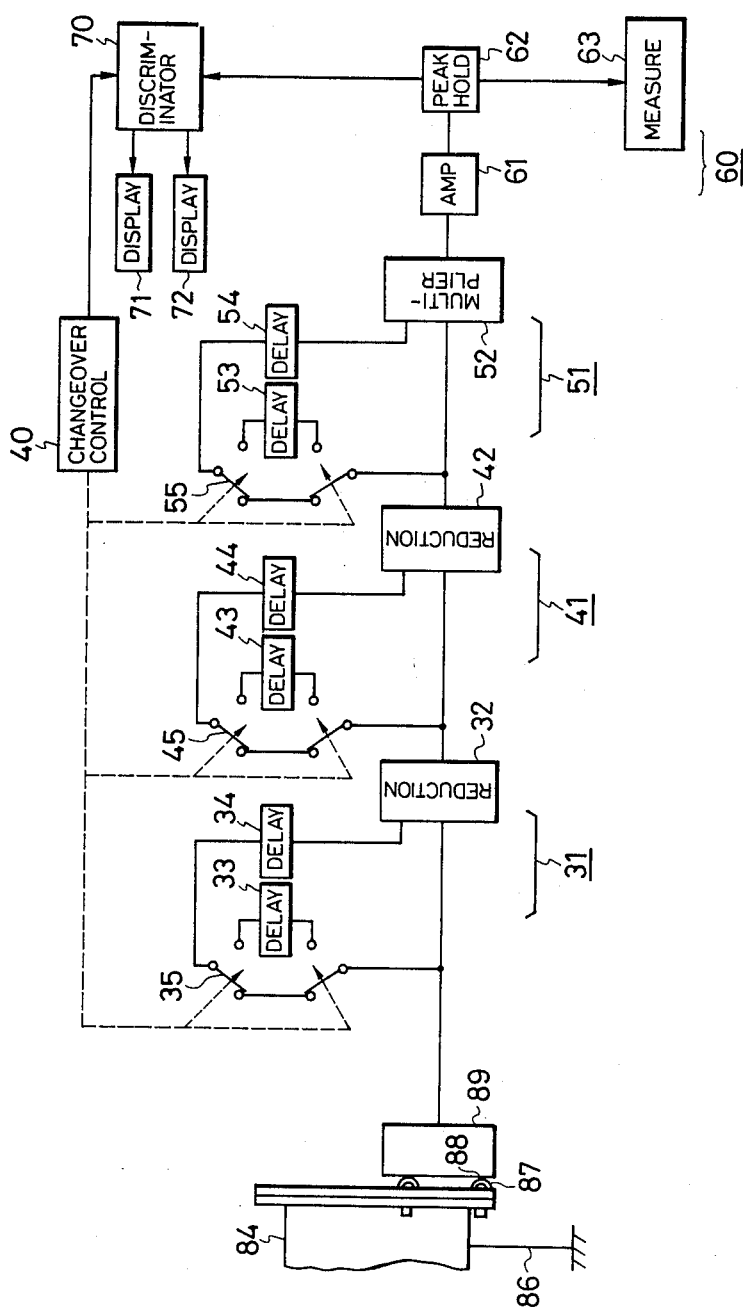
FIG. 11 is a circuit construction according to another embodiment of the present invention.

FIG. 11 is a block circuit diagram of a partial discharge monitoring device according to another embodiment of the present invention. In FIG. 11, the device comprises an input circuit 89 directly connected by detection terminals 88 of such as resilient contactor, to a pair of bolts 87 of a grounding metal portion of a high voltage apparatus, e.g. a metal container 84 of a GIS, series connected phase shift/reduction circuits 31 and 41, a phase shift/multiplying circuit 51, an output circuit 60 composed of an amplifier 61 and a peak hold circuit 62, a measuring device 63 such as waveform monitor or counter, a discriminator 70 and display devices 71 and 72 for displaying respective void corona and corona in SF6 gas. The phase shift/reduction circuit 31 includes a pair of delay circuits 33 and 34 having delay times of 8 nS and 2 nS, respectively, and a reduction circuit 32. The phase shift/reduction circuit 41 includes a pair of delay circuits 43 and 44 having delay time of 8 nS and 2 nS, respectively, and a reduction circuit 42. The delay circuits of the phase shift/reduction circuit 31 and 41 can be selectively connected in circuit by changeover circuits 35 and 45 under a control of a changeover control portion 40 so that each of these delay circuits can provide delay time of 2 nS or 10 nS. The phase shift/multiplying circuit 51 includes a pair of delay circuits 53 and 54 having delay times 16 nS and 4 nS, respectively, and a multiplier circuit 52. The delay circuits 53 and 54 are controlled by a changeover circuit 55 so that they can provide a delay of 4 nS or 20 nS.

FIGS. 12 and 13 show partial discharge pulse in the embodiment in FIG. 11, with noise waveform being omitted. In FIG. 12, the delay time of each of the phase shift/reduction circuits 31 and 41 is made equal to 2 nS which is substantially equal to a pulse width of a corona pulse PS in SF6 gas and, in FIG. 13, it is made equal to 10 nS which is substantially equal to a pulse width of void corona pulse PV. In these figures, the waveform of the pulse is assumed as rectangular for simplicity of explanation. In these figures, 89W depicts an input waveform of the phase shift/reduction circuit 31, 31W an output waveform of the circuit 31, 41W an output waveform of the circuit 41, 54W an output waveform of the delay circuit 54 of the phase shift/reduction circuit 51 and 62W an output waveform of the peak hold circuit 62.

In FIG. 12, the corona pulse PS produced in SF6 gas is delayed by 2 nS and reduced in the same way as mentioned previously in the phase shift/reduction circuit 31, resulting in a pulse series 31PS composed of 2 pulses. The latter pulse series is delayed by 12 S and reduced similarly in the phase shift/reduction circuit 41 resulting in a pulse series 41PS composed of three pulses. The pulse series 41PS is delayed by 4 nS by the delay circuit 54 and a resultant pulse series 54PS is multiplied by the pulse series 41PS in the phase shift/multiplying circuit 51, resulting in a single corona pulse 51PS having increased magnitude. The pulse 51PS is further amplified by the amplifier 61 and is processed by the peak hold circuit 62 which may be composed of an integration circuit etc. to convert it into a rectangular pulse 62PS suitable for monitoring. The rectangular pulse 62PS in supplied to the measuring device 63 and the discrimination circuit 70.

On the other hand, the void corona pulse PV is converted by the phase shift/reduction circuit 31 into a pulse series 31PV composed of two pulses each having width 2 nS and through a pulse series 41PV to a pulse series 54PV similarly. Since there is no pulses in the series 41PV and 54PV which occur simultaneously, the noises are removed by the multiplier circuit 51.

When the delay time is changed to 10 nS, the pulses PS and PV appear at the outputs of the phase shift/multiplier circuit 51 as pulse 51PS and 51PV, respectively, and the peak hold circuit 62 provides pulses 62PS and 62PV as shown in FIG. 13. The discriminator circuit 70 operates to compare an input pulse before a changeover of the delay circuit with an input pulse after the changeover at a time point of the changeover to judge a detection pulse as a void corona if it is detected only when Td=10 ns and to send the detection pulse to the display device 71 for display. If it detects any pulse when Td=2 nS as well as 10 nS, it judges the pulse as a corona in SF6 gas and sends it to the display device 72. Thus, it is possible to judge whether the detected pulse is void corona or corona in gas.

When the apparatus to be tested is a SF6 gas insulated apparatus, both void corona and corona in gas are due to the internal partial discharges and when the apparatus is a solid material insulated apparatus, void corona is due to an internal partial discharge and corona in gas is due to the external noise.

In order to discriminate corona in oil from void corona and corona in gas, it may be enough to add a further selection of the delay of 500–1000 nS.

When the apparatus to be tested is a SF6 gas insulated or solid material insulated apparatus, a bandpass amplifier having a passing range Wb of 50 MHz to 1000 MHz and a noise blocking range below the passing range is added to the input side of the measuring device. With this construction, external pulsated noise such as thyristor noise, power cable corona pulses discharge pulse in oil and external continuous noise such as broadcasting wave are effectively reduced.

Figure 14:
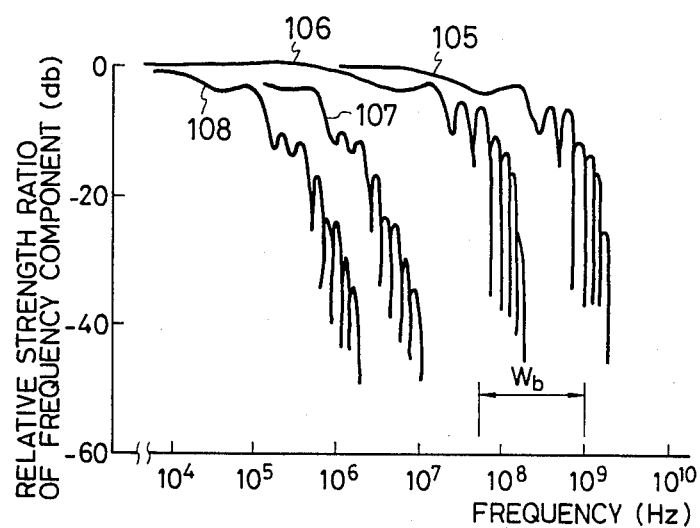
FIG. 14 is a characteristics wire showing a relative magnitude ratio of frequency components of the partial discharge pulse signal and external noise.

FIG. 14 is a graph showing relative strength of frequency components of partial discharge pulse and noise pulse. In FIG. 14, a curve 105 depicts relative strenght of frequency components of a partial discharge pulse in SF6 gas, 106 that of a void discharge pulse, 107 that of a commutation noise of thyristor and 108 that of a partial discharge pulse in oil. As is clear from FIG. 14, upper frequency limits of the partial discharge in SF6 gas and the void discharge are distributed over a frequency range from 50 MHz to 2000 MHz, while upper limits of the commutation noise, the discharge pulse in oil produced in an oil filled device and power cable corona are districted in ranges below about 10 MHz, below several MHz and below about 10 MHz, respectively.

Figure 15:
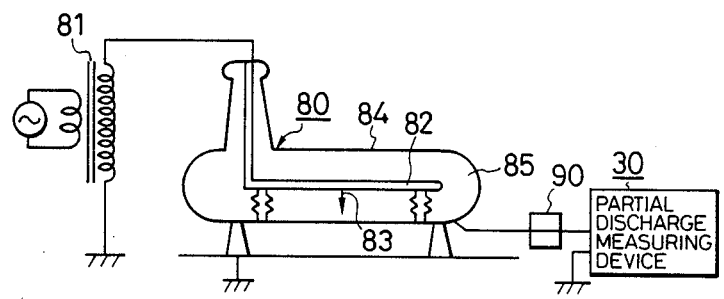
FIG. 15 is a test circuit diagram showing another embodiment of the present invention, which has a band amplifier connected to the input side thereof.
Figure 16:
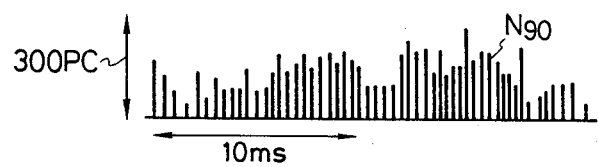
FIG. 16 shows output signal waveform of the band amplifier in FIG. 15.
Figure 17:
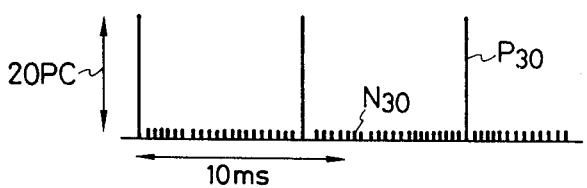
FIG. 17 is an output signal waveform of a partial discharge measuring device in FIG. 15.

FIG. 15 shows another embodiment of the present invention in which a bandpass amplifier 90 is added to the embodiment shown in FIG. 11. In FIG. 15, an apparatus 80 having a sealed container 84 which contains a high voltage bus 82 and filled with SF6 gas 85 of about 3 Kg·f/cm$^2$ is used as a sample to be tested and a partial discharge measuring device 30 constructed as shown in FIG. 11 is connected through the bandpass amplifier 90 to the sealed container 84. An A.C voltage of 12 KV is applied from a high voltage source 81 to the bus 82 to produce partial discharge at a protrusion 83 on the bus 82 in SF6 gas. The partial discharge signal is supplied together with thyrister noise of about 3000 PC produced by a thyrister inverter (not shown) connected in parallel to the power source 81, through the amplfier 90 to the test circuit 30. The delay time Td of each of phase shift/reduction circuits is set as 10 bnS and the passband of the amplifier is 50 MHz to 1000 MHz. An output signal of the bandpass amplifier 90 is shown in FIG. 16. In FIG. 16, although the highly frequent thyrister noise N90 is reduced to about 300 PC by the amplifier 90, it is impossible to detect the partial discharge in SF6 gas produced at the protrusion 83. On the other hand, the thyrister noise N30 is reduced to one tenth according to the S/N ratio shown in FIG. 6, as shown in FIG. 17 and, therefore, the partial discharge pulse in SF6 gas of about 20 PC which, in FIG. 16, is hidden in the thyrister noise N90 can be outputted as P30 which is detectable.

As described hereinbefore, the partial discharge measuring device according to the present invention comprises a first phase shift/reduction circuit composed of a delay circuit having a delay time corresponding to a duration of a partial discharge pulse and a reduction circuit for providing an attenuation effect to noise having a rising and falling times each longer than the delay time, a second phase shift/reduction circuit having the same construction as that of the first phase shift/reduction circuit for converting an output noise of the latter into a noise pulse series of a plurality of discrete pulses each having reduced pulse width, and a phase shift/multiplying circuit composed of a delay circuit having delay time twice the delay time of the first or second phase shift/reduction circuit and a multiplying circuit for removing the noise pulse series. As a result, it is possible to reduce or remove single shot type noise or periodic noise having a rising or falling time longer than the pulse width of the partial discharge pulse signal. Further, the pulse signal in the form of the pulse series provided by the first and second phase shift/reduction circuits can be reverse-converted to a single pulse having a waveform analogous to that of the original pulse by the phase shift/multiplying circuit, whose S/N ratio is improved by the output circuit. Further, the present device having variable delay times can reduce the noise without deforming the pulse signal, in comparison with a conventional device using a filter.

I claim:

1. A noise removing circuit for use in a partial discharge measuring device for use with a high voltage apparatus responsive to an input signal composed of a partial discharge pulse signal having a pulse width in a predetermined time range and periodic noise having a period of time longer than said predetermined time range for removing the noise without deforming a waveform of the partial discharge pulse signal, said circuit comprising:

first phase shift/reduction means, responsive to the input signal, for passing the input signal directly and delaying the input signal by a predetermined time, for reducing the delayed input signal with the directly passed input signal and producing an output, second phase shift/reduction means for passing the output of the first phase shift/reduction means directly and delaying the output by the predetermined time for reducing the delayed output with the directly passed output and producing an output signal, and phase shift/multiplying means for directly passing the output signal of the second phase shift/reduction means while delaying the output signal by a time twice as much as the predetermined time and for multiplying the directly passed output signal from the second phase shift/reduction means with the delayed output signal.

2. The circuit as claimed in claim 1, wherein said predetermined time is 2 nS to 4 nS.

3. The circuit as claimed in claim 1, wherein said predetermined time is 10 nS to 30 nS.

4. The circuit as claimed in any of claim 1 to 3, wherein each of said first and second phase shift/reduction means comprises a 180° distributor composed of a high frequency transformer and a mixer composed of one of a high frequency transformer and resistance means, said 180° distributor being connected through a delay circuit to said mixer.

5. The circuit as claimed in any of claim 1 to 3, wherein said predetermined time is variable according to a width of the partial discharge pulse signal dependent upon the kind of partial discharge.

6. The circuit as claimed in any of claim 1 to 3, wherein said input signal is supplied to said first phase shift/reduction means through a bandpass amplifier having a pass band of 50 MHz to 1000 MHz.

7. The circuit as claimed in claim 4, wherein said predetermined time is variable according to a width of the partial discharge pulse signal dependent upon the kind of partial discharge.

8. The circuit as claimed in claim 4, wherein said input signal is supplied to said first phase shift/reduction means through a bandpass amplifier having a passband of 50 MHz to 1000 MHz.

9. The circuit as claimed in claim 5, wherein said input signal is supplied to said first phase shift/reduction means through a bandpass amplifier having a passband of 50 MHz to 1000 MHz.

* * * * *

UNITED STATES PATENT AND TRADEMARK OFFICE
CERTIFICATE OF CORRECTION

PATENT NO. : 4,710,705
DATED : December 1, 1987
INVENTOR(S) : Osamu Kawabata

It is certified that error appears in the above-identified patent and that said Letters Patent is hereby corrected as shown below:

```
Column 1, line 8, delete "a";
         line 8, "measuring" should be --measuring a--;
         line 32, "frequeency" should be --frequency--.

Column 3, line 40, delete "is";
         line 55, delete "is".

Column 4, line 9, "shows" should be --shows an--.

Column 5, line 13, "P10," should be --P12--.

Column 6, line 12, delete "11";
         line 13, after "circuit" insert --11--.

Column 7, line 3, "teh" should be --the--;
         line 11, "the other" should be --one--.

Column 10, line 45, "in" should be --is--.
```

UNITED STATES PATENT AND TRADEMARK OFFICE
CERTIFICATE OF CORRECTION

PATENT NO. : 4,710,705
DATED : December 1, 1987
INVENTOR(S) : Osamu Kawabata

It is certified that error appears in the above-identified patent and that said Letters Patent is hereby corrected as shown below:

Column 11, line 21, "strenght" should be --strength--;

line 50, "bnS" should be --nS--.

Signed and Sealed this

Twenty-seventh Day of September, 1988

Attest:

DONALD J. QUIGG

*Attesting Officer*          *Commissioner of Patents and Trademarks*